(12) United States Patent
Apel

(10) Patent No.: US 6,806,558 B2
(45) Date of Patent: Oct. 19, 2004

(54) INTEGRATED SEGMENTED AND INTERDIGITATED BROADSIDE- AND EDGE-COUPLED TRANSMISSION LINES

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/121,066

(22) Filed: Apr. 11, 2002

(65) Prior Publication Data

US 2003/0193079 A1 Oct. 16, 2003

(51) Int. Cl.$^7$ .............................................. H01L 39/00
(52) U.S. Cl. ....................... 257/663; 257/662; 336/200
(58) Field of Search ................................ 257/663, 662; 336/200

(56) References Cited

U.S. PATENT DOCUMENTS

| | | | |
|---|---|---|---|
| 4,992,769 A | 2/1991 | Oppelt | |
| 4,999,597 A | 3/1991 | Gaynor | |
| 5,146,191 A | 9/1992 | Mandai et al. | |
| 5,200,718 A | 4/1993 | Kato | |
| 5,430,424 A | 7/1995 | Sato et al. | |
| 5,497,137 A | 3/1996 | Fujiki | |
| 5,767,753 A | 6/1998 | Ruelke | |
| 5,793,272 A | 8/1998 | Burghartz et al. | |
| 5,852,866 A | 12/1998 | Kuettner et al. | |
| 5,877,667 A | 3/1999 | Wollesen | |
| 5,884,990 A * | 3/1999 | Burghartz et al. | 336/200 |
| 5,892,668 A | 4/1999 | Okamoto et al. | |
| 5,969,590 A | 10/1999 | Gutierrez | |
| 6,097,273 A | 8/2000 | Frye et al. | |
| 6,198,374 B1 | 3/2001 | Abel | |
| 6,263,198 B1 | 7/2001 | Li | |
| 6,278,340 B1 | 8/2001 | Liu | |
| 6,317,965 B1 | 11/2001 | Okamoto et al. | |
| 6,396,362 B1 | 5/2002 | Mourant et al. | |
| 6,407,647 B1 | 6/2002 | Apel et al. | |
| 6,437,568 B1 | 8/2002 | Apel et al. | |

FOREIGN PATENT DOCUMENTS

EP            1037300 A1       9/2000

OTHER PUBLICATIONS

Brown et al.; "Printed Microwave Couplers With Thermal Isolation"; 1997 IEEE MTT–S International Microwave Symposium Digest; Denver, Jun. 8–13, 1997; IEEE vol. 2 pp. 983–986.

(List continued on next page.)

*Primary Examiner*—David L. Talbott
*Assistant Examiner*—Luan Thai
(74) *Attorney, Agent, or Firm*—Bever, Hoffman & Harms, LLP; James E. Parsons

(57) ABSTRACT

A combination edge- and broadside-coupled transmission line element formed in an integrated circuit chip, using semiconductor processes, in a stack of metal layers separated by dielectric layers. Each of the metal layers includes a number of transmission lines. Interconnects between the transmission lines are formed at predetermined locations, each interconnect electrically connecting together a group of the transmission lines to form a conductor. The efficiency of the coupling between the lines in the different conductor is increased by positioning the lines such that both edge and broadside-coupling is realized. For example, at least one of the transmission lines in one of the conductors is positioned either above or below a transmission line in the other conductor to achieve broadside-coupling and laterally adjacent to another transmission line in the other conductor to achieve edge-coupling. In a preferred embodiment each of the lines in one of the conductors is edge- and broadside-coupled to lines in the other conductor. The transmission line element may contain two, three or more conductors, and each conductor may contain two, three or more transmission lines. The transmission line element can be used, for example, to fabricate various types of balanced and unbalanced transformers.

13 Claims, 12 Drawing Sheets

OTHER PUBLICATIONS

Toyoda, Ichihiko, Hirano, Makoto, and Tokumitsu, Tsuneo, "Three–Dimensional MMIC and Its Application: An Ultra–Wideband Miniature Balun," IEICE Trans. Electron., vol. E78–C, No. 8, Aug. 1995, pp. 919–924.

Engels, M., and Jansen, R.H., Modeling and Design Of Novel Passive MMIC Components With Three And More Conductor Levels,: 1994 IEEE MTT–S Digest (1994), at 1293–1296.

Cho, Choonsik, and Gupta, K.C., "A New Design Procedure for Single–Layer and Two–Layer Three–Line Baluns," IEEE Transactions on Microwave Theory and Techniques, vol. 46, No. 12, Dec. 1998, pp. 2514–2519.

Engels, M., and Jansen, R.H., "A Novel Compact Balun Structure For Multilayer MMICs," 26$^{th}$ EuMC, Sep. 9–12, 1996, Hotel Hilton Atrium, Prague, Czech Republic, pp. 692–696.

* cited by examiner

INTEGRATED SEGMENTED AND INTERDIGITATED BROADSIDE- AND EDGE-COUPLED TRANSMISSION LINES

REFERENCE TO RELATED APPLICATIONS

This application is related to commonly owned application Ser. No. 09/768,865, filed Jan. 23, 2001, and application Ser. No. 09/863,779, filed May 22, 2001, each of which is incorporated herein by reference in its entirety.

FIELD OF THE INVENTION

The present invention relates to impedance transforming elements, and in particular to segmented and interdigitated integrated coupled transmission line elements.

BACKGROUND OF THE INVENTION

The use of twisted pairs of copper wires to form coupled transmission line elements is well known. These transmission line elements may be used to create balanced and unbalanced transmission lines, balanced-unbalanced (balun) transmission lines, and current and voltage inverters. Examples of the use of conventional transmission line elements are presented in C. L. Ruthroff, "Some Broad-Band Transformers," *Proceedings of the IRE* (Institute for Radio Engineers), vol. 47, pp. 1337–1342 (August 1959), which is incorporated herein by reference. These transmission line elements are typically found in forms that are useful in frequency bands through UHF.

The use of such transmission line elements in integrated circuits such as RF power amplifiers and low noise amplifiers that operate at higher than UHF frequencies is desirable. However, the incorporation of these conventional transmission line elements into RF devices such as cellular telephones is not competitively feasible due to size and cost. Moreover, conventional coupled transmission line elements are not suitable for use in the desired frequency range.

Therefore, a need has arisen for a coupled transmission line element that addresses the disadvantages and deficiencies of the prior art.

SUMMARY OF THE INVENTION

A transmission line element in accordance with this invention comprises a plurality of metal layers that are formed in an integrated circuit chip. Each of the metal layers is separated from an adjacent metal layer by a dielectric layer. In a bifilar embodiment, a first conductor comprises at least two transmission lines in different metal layers; and a second conductor comprises at least two transmission lines also in different metal layers. The transmission lines in the first and second conductors run parallel to each other. A plurality of interconnects are located at predetermined positions along the conductors, each of the interconnects containing an electrical connection between the transmission lines in the first conductor and an electrical connection between the transmission lines in the second conductor. At least one transmission line in the first conductor is edge-coupled to at least one transmission line in the second conductor and broadside-coupled to at least one other transmission line in the second conductor.

In addition, at least a second transmission line in said first conductor may be edge-coupled to at least one transmission line in said second conductor and broadside-coupled to at least one other transmission line in said second conductor.

The first and second conductors may be formed in the shape of a spiral or a variety of other shapes.

At least one of the interconnects may comprise a via through the dielectric layer, a first tongue extending to the via from one of said transmission lines and a second tongue extending to the via from another one of said transmission lines.

In one bifilar embodiment the first conductor comprises two transmission lines and the second conductor comprises two transmission lines. Alternatively, the first conductor comprises three transmission lines and said second conductor comprises three transmission lines.

In a trifilar embodiment the transmission line element comprises a third conductor, and each of said first, second and third conductors may comprise three transmission lines.

BRIEF DESCRIPTION OF THE DRAWINGS

For a more complete understanding of the present invention and for further features and advantages, reference is now made to the following description taken in conjunction with the accompanying drawings, in which.

DESCRIPTION OF THE INVENTION

Figure 1:
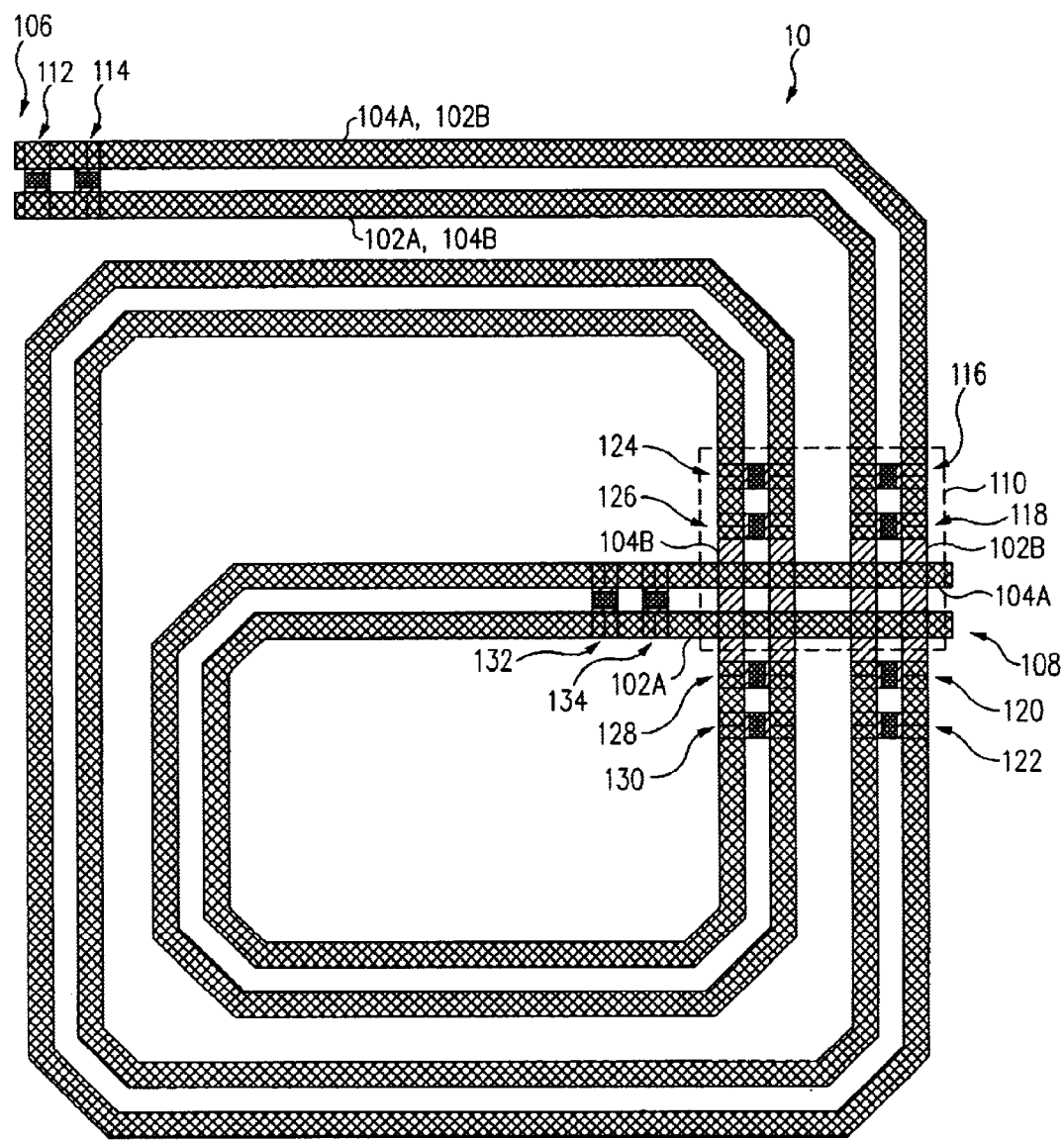
FIG. 1 is a top view of an bifilar broadside- and edge-coupled transmission line element according to the invention.
Figure 4:
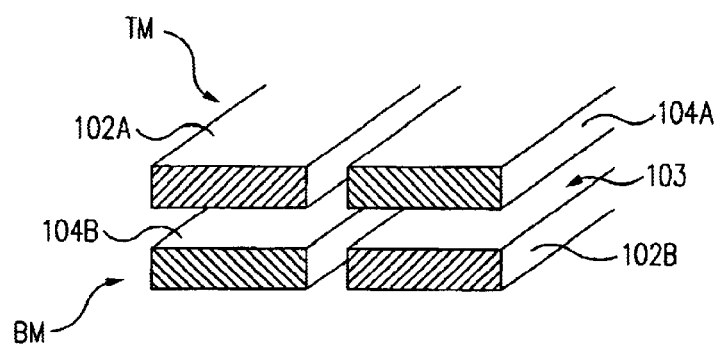
FIG. 4 is a cross-sectional view of the broadside- and edge-coupled transmission line element of FIG. 1.

FIG. 1 shows a general view of a bifilar transmission line element 10 in accordance with the invention. Bifilar element 10 includes two pairs of broadside- and edge-coupled transmission lines formed in two metal layers separated by a dielectric layer. FIG. 4 illustrates the relative positions of the transmission line pairs. Lines 104A and 102A are formed in a top metal layer TM, and lines 102B and 104B are formed in a bottom metal layer BM. The top and bottom metal layers TM and BM are separated by a dielectric layer 103. This structure is fabricated using conventional semiconductor processes that are well-known to those skilled in the art and will not be detailed here. Metal layers TM and BM may be formed, for example, of aluminum, gold, or another conductive material.

As shown in FIG. 1, the transmission line pairs extend from a first terminus 106 to a second terminus 108. While the transmission lines in FIG. 1 are laid out in the pattern of a square spiral, many other geometries may be used. For example, other spiral shapes (circular, rectangular, etc.) can be used, or the transmission lines can be linear or variety of other shapes. This invention is not limited to any particular shape of transmission lines.

Transmission lines 102A, 102B, 104A, 104B are "segmented" in the sense that at predetermined intervals line 102A is connected to line 102B, and line 104A is connected to line 104B. Lines 102A, 102B thus together constitute a first conductor 102 and lines 104A 104B together constitute a second conductor 104. The intervals between such connections are referred to as "segments". Referring to FIG. 1, the connections are made at interconnects 112, 114, 116, 118, 120, 122, 124, 126, 128, 130, 132 and 134. The length between interconnects 112, 114 (terminus 106) and interconnects 116, 118 constitutes a first segment, the length between interconnects 120, 122 and interconnects 124, 126 constitutes a second segment, and the length between interconnects 128, 130 and interconnects 132, 134 (terminus 108) constitutes a third segment. Preferably, the interconnects are spaced such that, at the operating frequency of the transformer, the segments are less than 30 degrees long.

Figure 3:
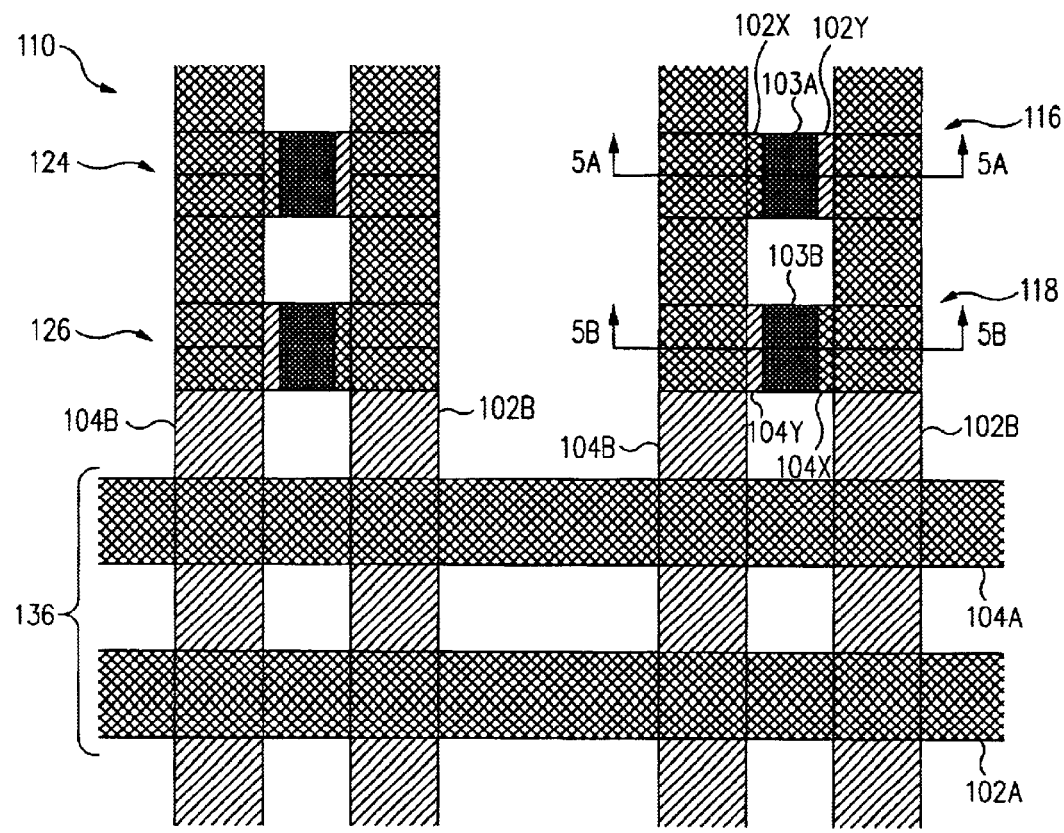
FIG. 3 is a composite view of the top and bottom metal layers in the crossover region of the transmission line element of FIG. 1.
Figure 5A:
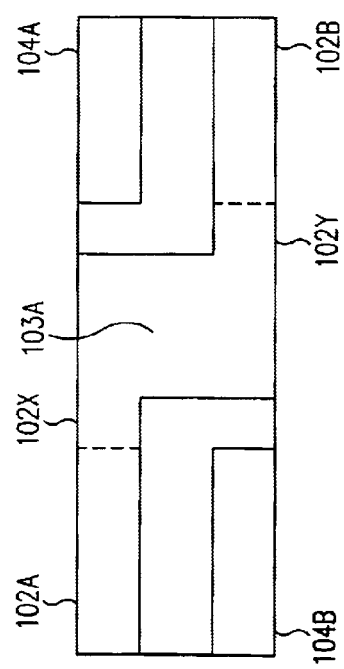
FIG. 5A is a view of the transmission line element of FIG. 1 taken at cross-section 5A—5A of FIG. 3, showing the via that connects one pair of associated transmission lines.
Figure 5B:
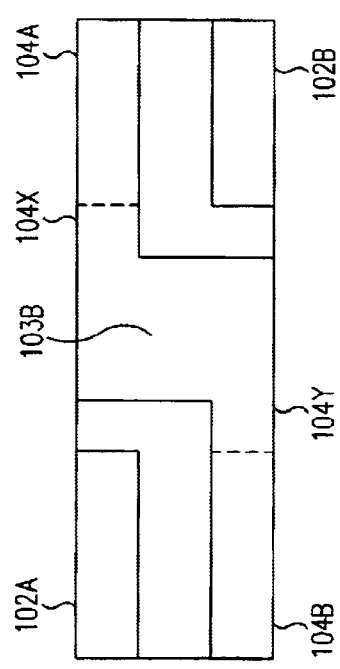
FIG. 5B is a view of the transmission lines of FIG. 1 taken at cross-section 5B—5B of FIG. 3, showing the via that connects the other pair of associated transmission lines.

FIG. 3 is a detailed view of the area 110 shown by the dashed lines in FIG. 1. Included are interconnects 116, 118, 124 and 126. The views at cross-sections 5A—5A and 5B—5B are shown in FIGS. 5A and 5B, respectively. Referring first to FIG. 5A, the top metal layer TM, which forms lines 104A and 102A, and the bottom metal layer BM, which forms lines 102B and 104B, are separated by a dielectric layer 103. Dielectric layer 103 may be made of bisbenzocyclobutene (BCB), a nitride or oxide of silicon, or some other insulating material. Dielectric layer 103 is deposited using conventional techniques.

Figure 2A:
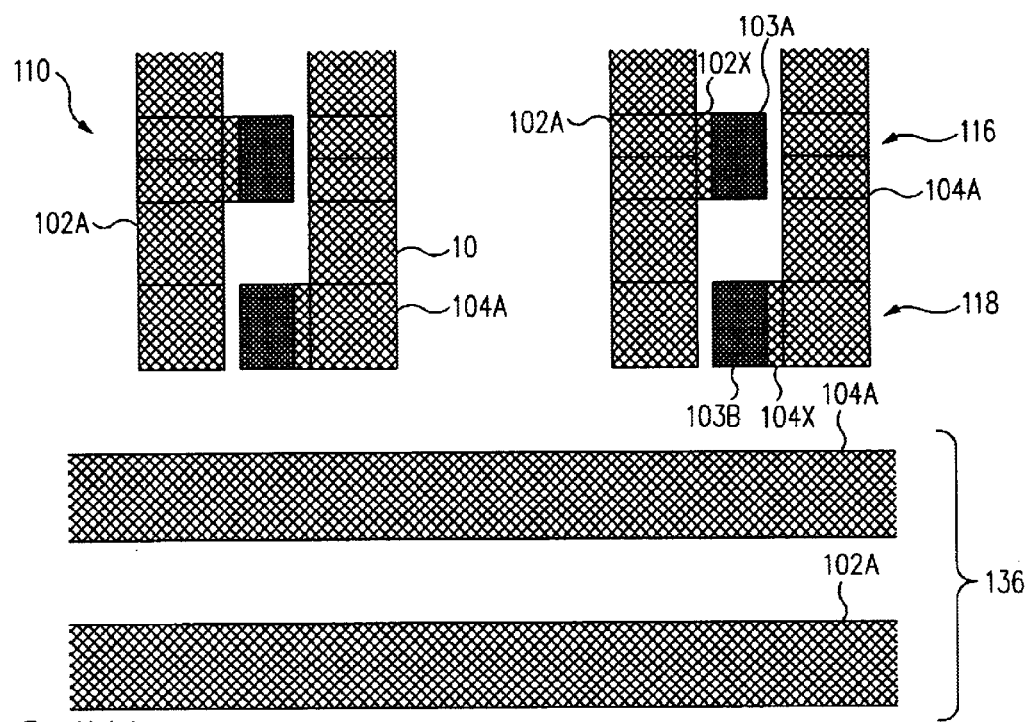
FIG. 2A is a view of the top metal layer in the crossover region of the transmission line element of FIG. 1.
Figure 2B:
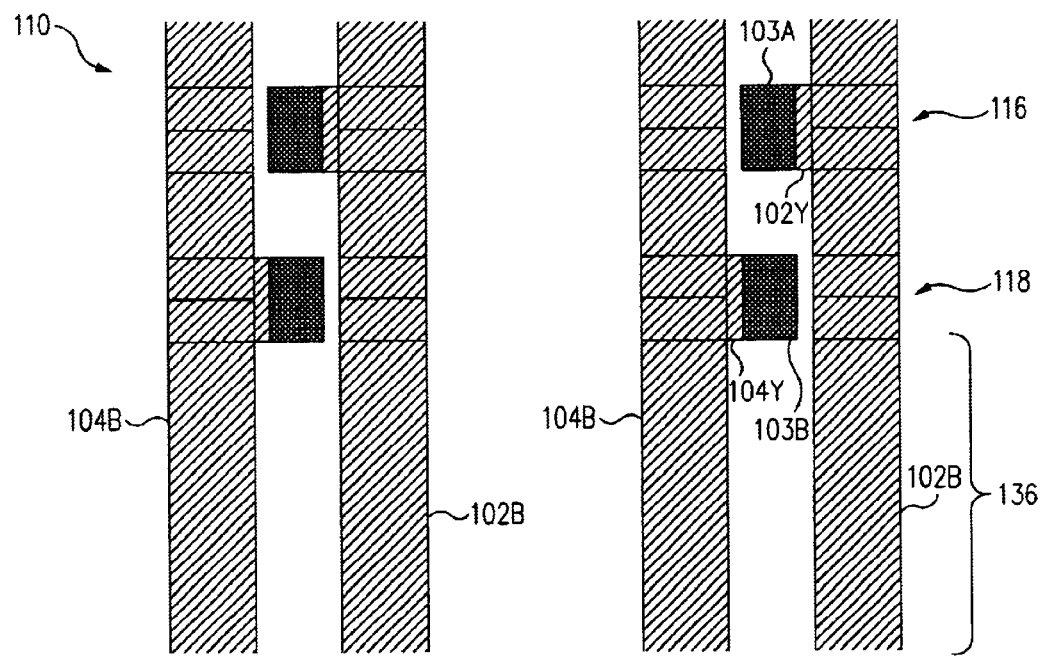
FIG. 2B is a view of the bottom metal layer in the crossover region of the transmission line element of FIG. 1.

FIG. 2A shows the top metal layer TM in area 110, and FIG. 2B shows the bottom metal layer BM in area 110. Referring to FIG. 2A, at interconnect 116 a tongue 102X extends from line 102A to a via 103A, and at interconnect 118 a tongue 104X extends from line 104A to a via 103B. Referring to FIG. 2B, at interconnect 116 a tongue 102Y extends from line 102B to via 103A, and at interconnect 118 a tongue 104Y extends from line 104B to via 103B. Thus, as shown in FIG. 5A, at interconnect 116 an electrical connection is formed between lines 102A and 102B by means of tongue 102X, the metal in via 103A, and tongue 102Y. As shown in FIG. 5B, at interconnect 118 an electrical connection is formed between lines 104A and 104B by means of tongue 104X, the metal in via 103B, and tongue 104Y. Using tongues and vias, similar connections between lines 102A and 102B and lines 104A and 104B are formed at interconnects 112, 114, 120, 122, 124, 126, 128, 130, 132 and 134.

As shown in FIGS. 2A and 2B, area 110 includes a crossover region 136, where the transmission lines cross. In crossover region 136 the top metal layer TM terminates between interconnects 118 and 120, and the bottom metal layer BM terminates between interconnect 134 and terminus 108, thereby allowing the transmission lines to pass from the inside of the spiral to terminus 108.

By reference to FIG. 4 it will be understood that broadside coupling occurs between lines 102A and 104B and between lines 104A and 102B; and edge coupling occurs between lines 102A and 104A and between lines 102B and 104B. As compared with the broadside-coupled arrangement described in the above-referenced application Ser. No. 09/768,865, the addition of segmented edge-coupling between the lines and phasing the alternate interdigitated segments increases the surface area for the RF currents and enhances the coupling coefficient. Transformer losses are significantly reduced. For example, simulated tests show a reduction of losses from −0.3 dB to −0.15 dB.

Figure 6A:
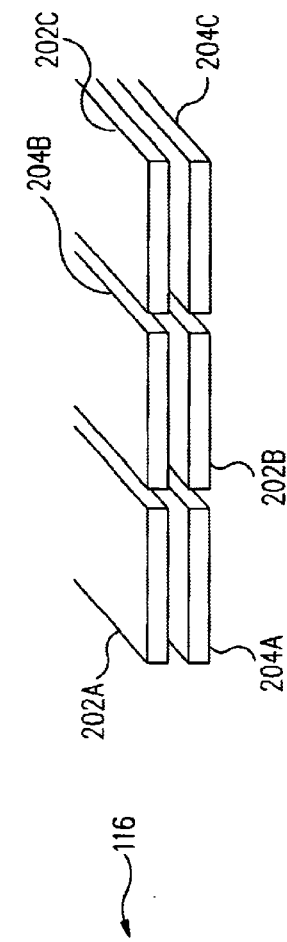
FIGS. 6A and 6B are cross-sectional views of alternative bifilar transmission line elements in accordance with the invention.
Figure 6B:
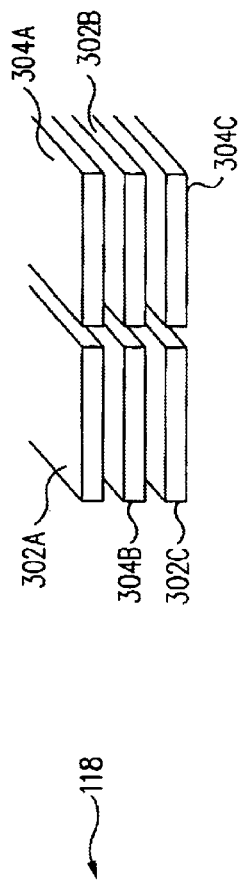

The embodiment described above is bifilar in the sense that in essence there are two conductors 102, 104 running adjacent to each other. Each conductor consists of two lines: 102A, 102B and 104A, 104B. The invention is not limited to this embodiment, however. In other bifilar embodiments, each of the two conductors may include three or more transmission lines formed in two, three or more metal layers. Two alternative embodiments are shown in FIGS. 6A and 6B. FIG. 6A shows a two-layer embodiment wherein each conductor includes three transmission lines. Transmission lines 202A, 204B and 202C are formed in the top metal layer, and transmission lines 204A, 202B and 204C are formed in the bottom metal layer. Lines 202A, 202B and 202C are connected together to form a conductor 202, and lines 204A, 204B and 204C are connected together to form a conductor 204. The connections between lines 202A–202C and 204A–204C are preferably made at interconnects similar to those shown in FIGS. 2A, 2B, 5A and 5B, the interconnects being spaced such that transmission line segments of an appropriate length are formed. FIG. 6B shows a three-layer embodiment wherein each conductor includes three transmission lines. Transmission lines 302A and 304A are formed in the top metal layer, transmission lines 302B and 304B are formed in the middle metal layer, and transmission lines 302C and 304C are formed in the bottom metal layer. Lines 302A, 302B and 302C are connected together to form a conductor 302, and lines 304A, 304B and 304C are connected together to form a conductor 304. The connections between lines 302A–302C and 304A–304C are preferably made at interconnects similar to those shown in FIGS. 2A, 2B, 5A and 5B, the interconnects being spaced such that transmission line segments of an appropriate length are formed.

In both of the embodiments shown in FIGS. 6A and 6A, it will be noted that any line that is located above, below or laterally adjacent to a given line in one of the conductors is a part of the other conductor. Taking line 202B in FIG. 6A as an example, line 204B lines directly above line 202B and lines 204A and 204C lie on opposite sides of line 202B. Line 202B is a part of conductor 202, and lines 204A, 204B and 204C are parts of conductor 204. This maximizes the extent of broadside- and edge-coupling between the signal in line 202B and the signal in lines 204A, 204B and 204C. In some embodiments, however, broadside- and edge-coupling may not be required with respect to all of the transmission lines.

The positions and locations of the termini and connecting ends shown in FIG. 1 and the accompanying diagrams are meant to be illustrative and not limiting. Other embodiments of the invention readily apparent to those skilled in the art will have such ends located in a variety of positions. Furthermore, it is to be understood that reference to the metal layers as "top" and "bottom" is purely arbitrary and that the position of the layers with respect to each other when looking downward on them could be reversed.

As noted above, the interconnects preferably are in the form shown in FIGS. 2A, 2B, 5A and 5B, with vias being formed in the dielectric layer laterally in between adjacent transmission lines. It will be understood, however, that other techniques and structures may be used to connect the transmission lines at the interconnects.

Figure 7A:
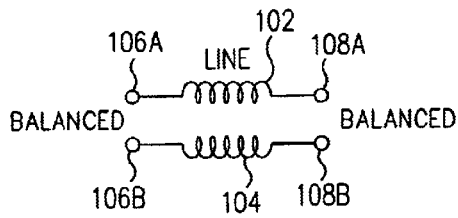
FIGS. 7A–7G are schematic circuit diagrams of various transformers that may be fabricated using the transmission line element of this invention.
Figure 7B:
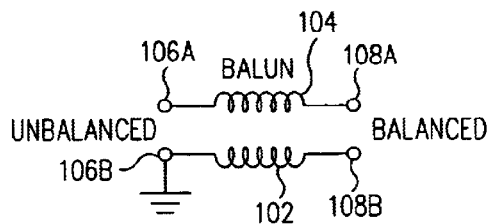
Figure 7C:
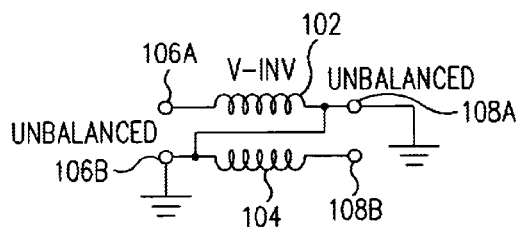
Figure 7D:
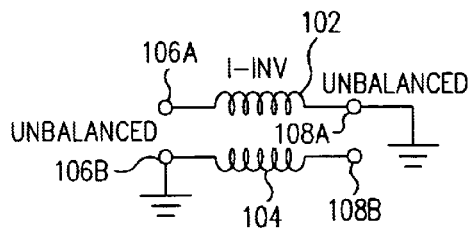
Figure 7E:
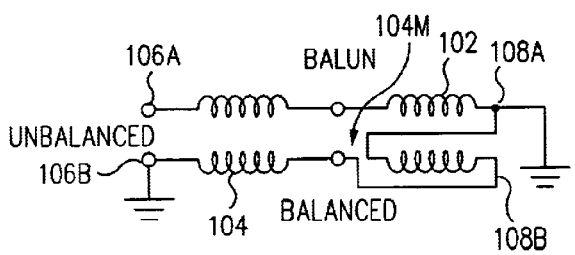
Figure 7F:
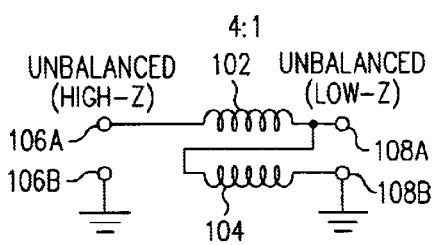

Referring again to FIG. 1, each of the conductors 102, 104 has a separate terminal at each of the termini 106 and 108. FIGS. 7A–7F illustrate how these terminals can be connected to form different types of transformers. In FIGS. 7A–7F, the terminal of conductor 102 at terminus 106 is designated 106A; the terminal of conductor 104 at terminus 106 is designated 106B; the terminal of conductor 102 at terminus 108 is designated 108A; and the terminal of conductor 104 at terminus 108 is designated 108B. Typically an input signal is applied at terminals 106A and 108A, and an output signal is generated at terminals 106B and 108B. FIG. 7A shows a balanced transformer. The version shown in FIG. 7B is similar but it is unbalanced because output terminal 106B is grounded. The embodiment of FIG. 7D is also unbalanced because both input terminal 108A and output terminal 106A are grounded. The embodiment of FIG. 7C is similar to the embodiment of FIG. 7D except that terminals 108A and 106B are tied together. Note that in the embodiments of FIGS. 7C, 7E and 7F, a connections is made between conductors 102 and 104 using vias at the specified locations in the transmission line.

The embodiments described above are bifilar, meaning that, regardless of how many transmission lines are present, they are connected together to form two conductors. Other embodiments according to this invention may include three or more separate conductors.

FIGS. 8–14 illustrate a trifilar transmission line element 401, in which there are three conductors 402, 404 and 406. Conductor 402 contains transmission lines 402A, 402B and 402C; conductor 404 contains transmission lines 404A, 404B and 404C; conductor 406 contains transmission lines 406A, 406B and 406C. Transmission line element 10 is in the form of a rectangular spiral, although any other shape could also be used, and interconnects 420, 422, 424, 426, 428, 430, 432 and 434 between the transmission lines in each conductor are formed at periodic intervals around the spiral. The spiral runs from a first terminus 412 to a second terminus 414, both of which are on the outside of the spiral, and the transmission lines run from the inside to the outside of the spiral in a crossover area 436.

Figure 8:
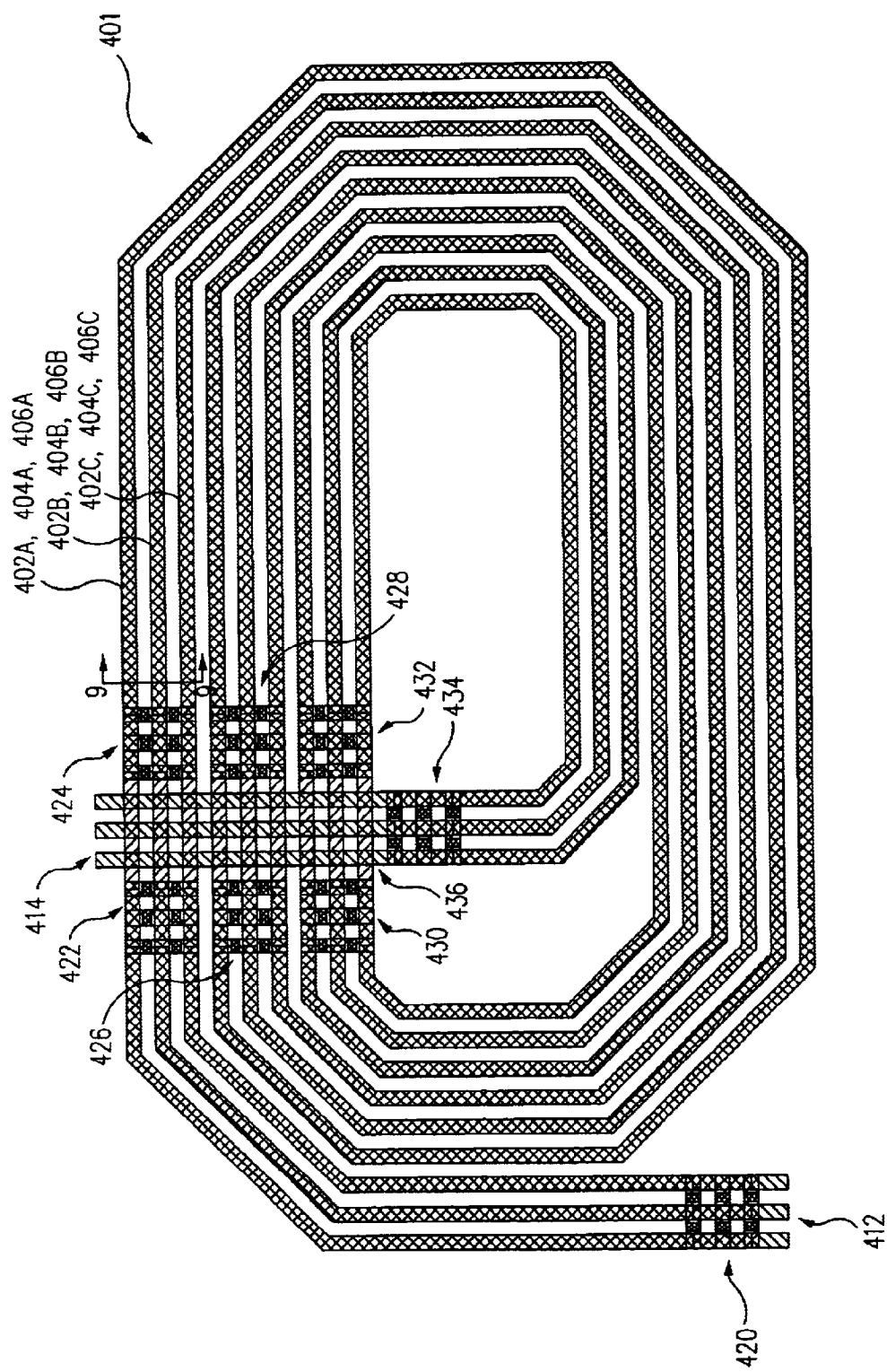
FIG. 8 is a top view of a trifilar broadside- and edge-coupled transmission line element according to the invention.
Figure 9:
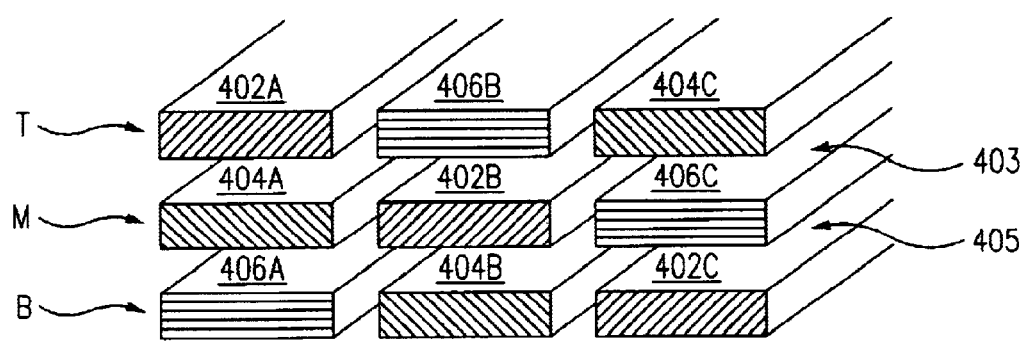
FIG. 9 is a cross-sectional view of the trifilar broadside- and edge-coupled transmission line element of FIG. 8.

The arrangement of transmission lines 402A–402C, 404A–404C, and 406A–406C is shown in FIG. 9, which is taken at cross-section 9—9 shown in FIG. 8. Lines 402C, 404B and 406A are formed in a bottom metal layer B, lines 402B, 404A and 406C are formed in a middle metal layer M, and lines 402A, 404C and 406B are formed in a top metal layer T. Bottom metal layer B and middle metal layer M are separated by a dielectric layer 405, and middle metal layer M and top metal layer T are separated by a dielectric layer 403. This stacked structure of metal lines and dielectric layers is fabricated using semiconductor processes well-known to those skilled in the art.

As FIG. 9 indicates, to maximize the broadside- and edge-coupling between the conductors, each transmission line is bounded above and/or below and laterally by transmission lines that are part of a different conductor. For example, transmission line 402B is bounded above and below by transmission lines 406B and 404B, respectively, and on opposite sides by transmission lines 404A and 406C. This configuration also provides a more uniform distribution of the capacitance between the transmission lines and ground.

Figure 10A:
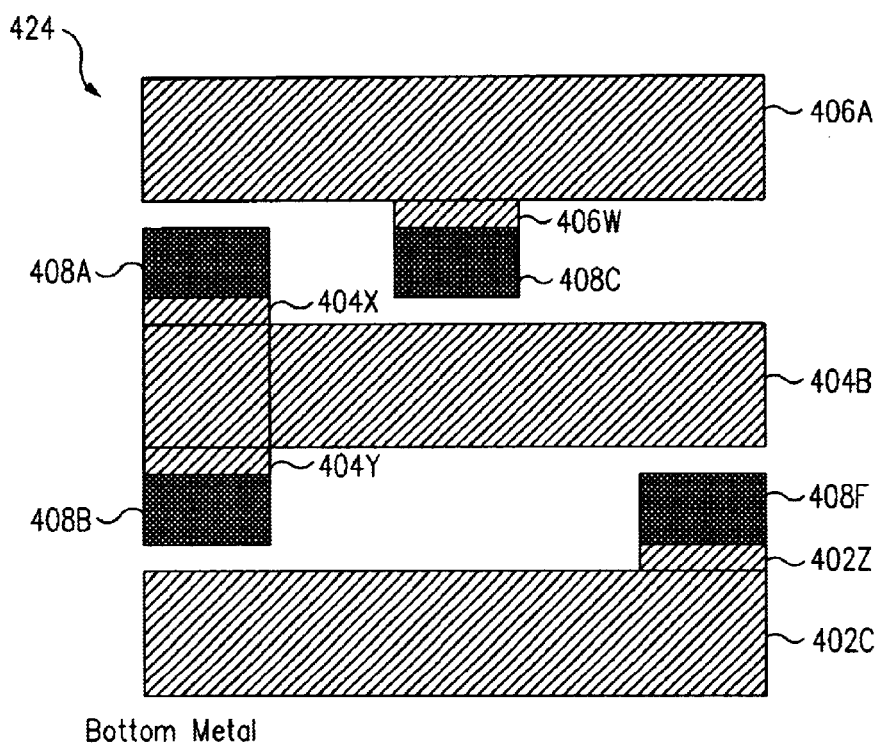
FIGS. 10A–10C are top views of the bottom, middle and top metal layers of an interconnect in the transmission line element of FIG. 8.
Figure 10B:
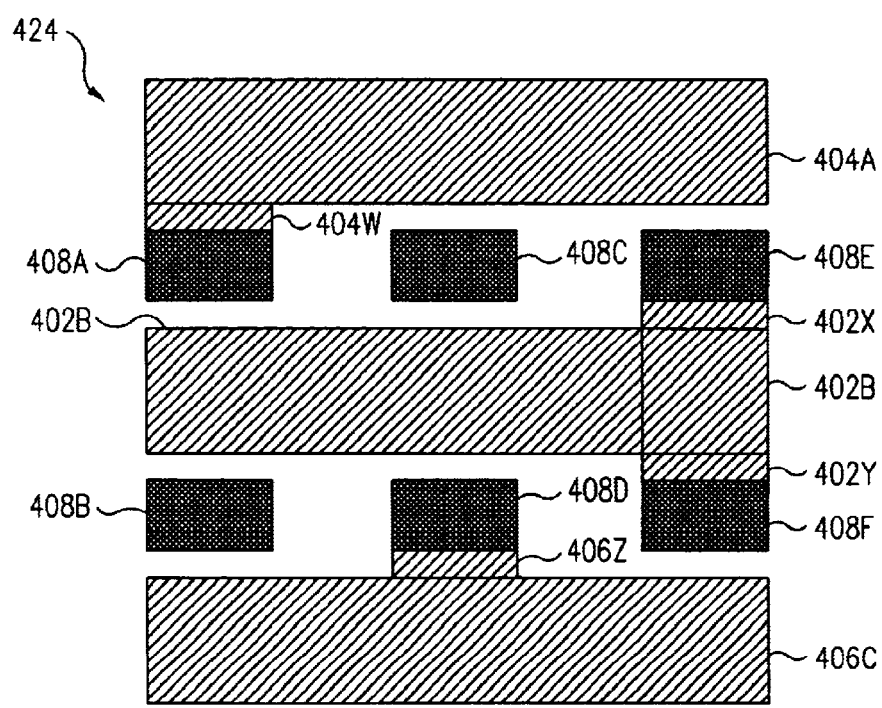
Figure 10C:
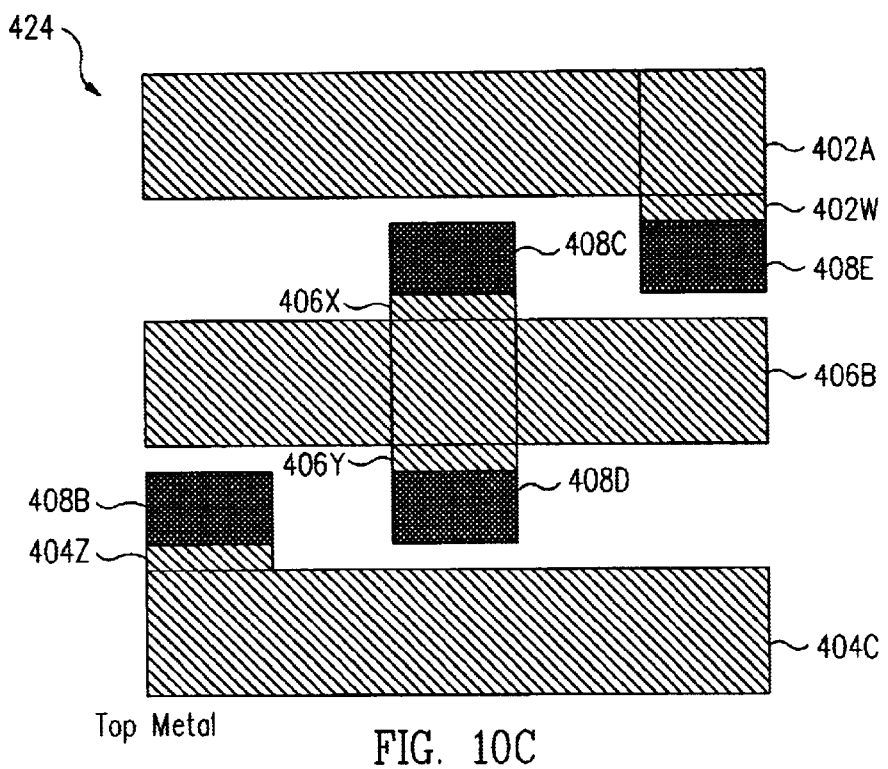
Figure 11:
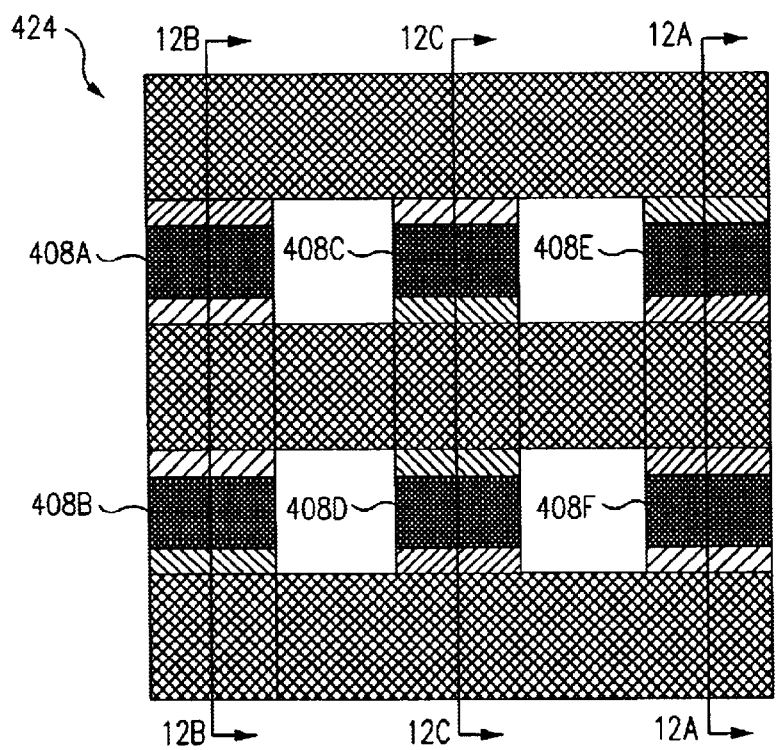
FIG. 11 is a top composite view of the interconnect in the transmission line element of FIG. 8.
Figure 12A:
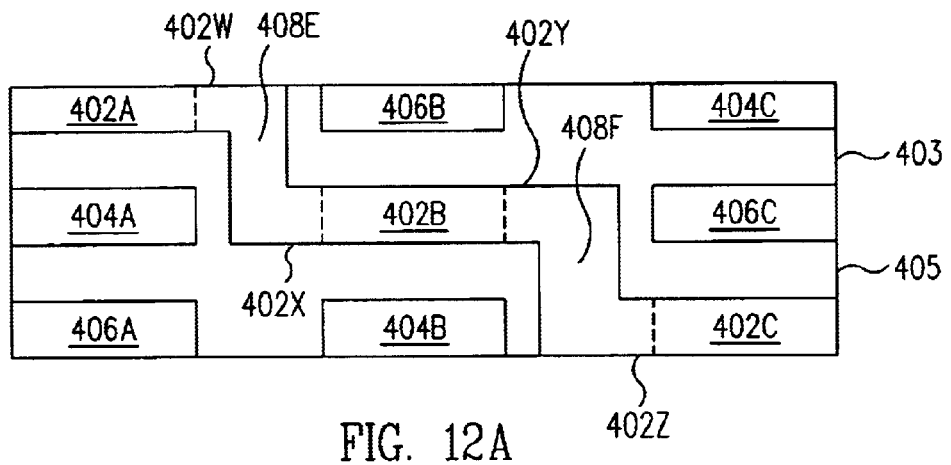
FIGS. 12A–12C are cross-sectional views of the interconnect in the transmission line element of FIG. 8.
Figure 12B:
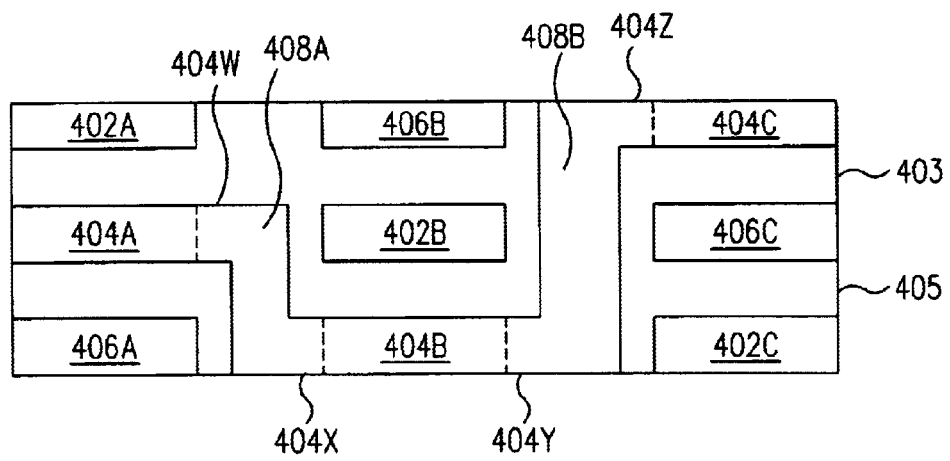
Figure 12C:
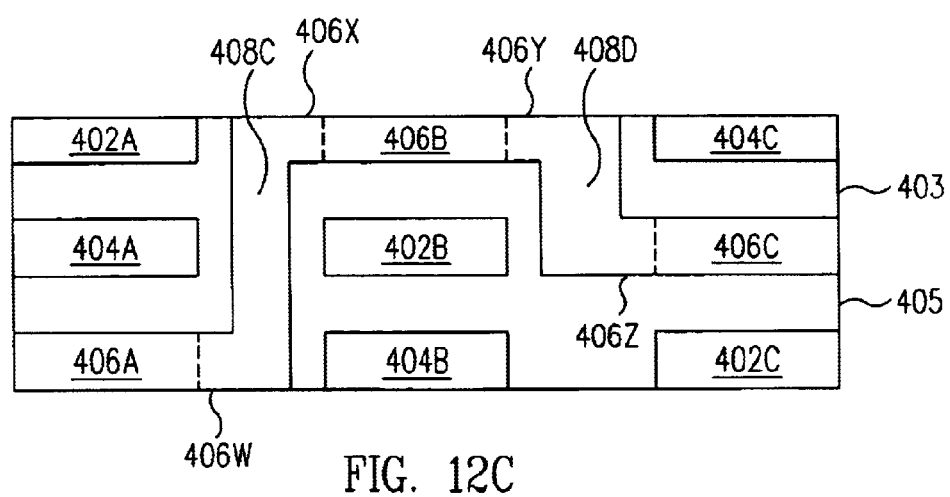

Interconnect 424 is shown in detail in FIGS. 10A–10C, 11 and 12A–12C. FIGS. 12A–12C are cross-sectional views taken at sections 12A—12A, 12B—12B and 12C—12C, respectively, shown in FIG. 11. As shown in FIG. 12A, transmission lines 402A, 402B and 402C are joined together by means of a via 408E through dielectric layer 403 and a via 408F through dielectric layer 405. Tongues 402W and 402X extend laterally from lines 402A and 402B, respectively, to make the connection between lines 402A and 402B through via 408E. Tongues 402Y and 402Z extend laterally from lines 402B and 402C, respectively, to make the connection between lines 402B and 402C through via 408E. In this manner lines 402A, 402B and 402C are joined together.

Similarly, transmission lines 404A–404C and transmission lines 406A–406C, respectively, are joined together as follows. As shown in FIG. 12B, lines 404A, 404B and 404C are joined together by means of a via 408A through dielectric layer 405 and a via 408B through dielectric layers 403 and 405. Tongues 404W and 404X extend laterally from lines 404A and 404B, respectively, to make the connection between lines 404A and 404B through via 408A. Tongues 404Y and 404Z extend laterally from lines 404B and 404C, respectively, to make the connection between lines 404B and 404C through via 4084. As shown in FIG. 12C, lines 406A, 406B and 406C are joined together by means of a via 408C through dielectric layer 403 and 405 and a via 408D through dielectric layer 403. Tongues 406W and 406X extend laterally from lines 406A and 406B, respectively, to make the connection between lines 406A and 406B through via 408C. Tongues 406Y and 406Z extend laterally from lines 406B and 406C, respectively, to make the connection between lines 406B and 406C through via 408D.

A top view of each metal layer in interconnect 424 is shown in FIGS. 10A, 10B and 10C. A composite top view of metal layers T, M and B is shown in FIG. 11.

Figure 13:
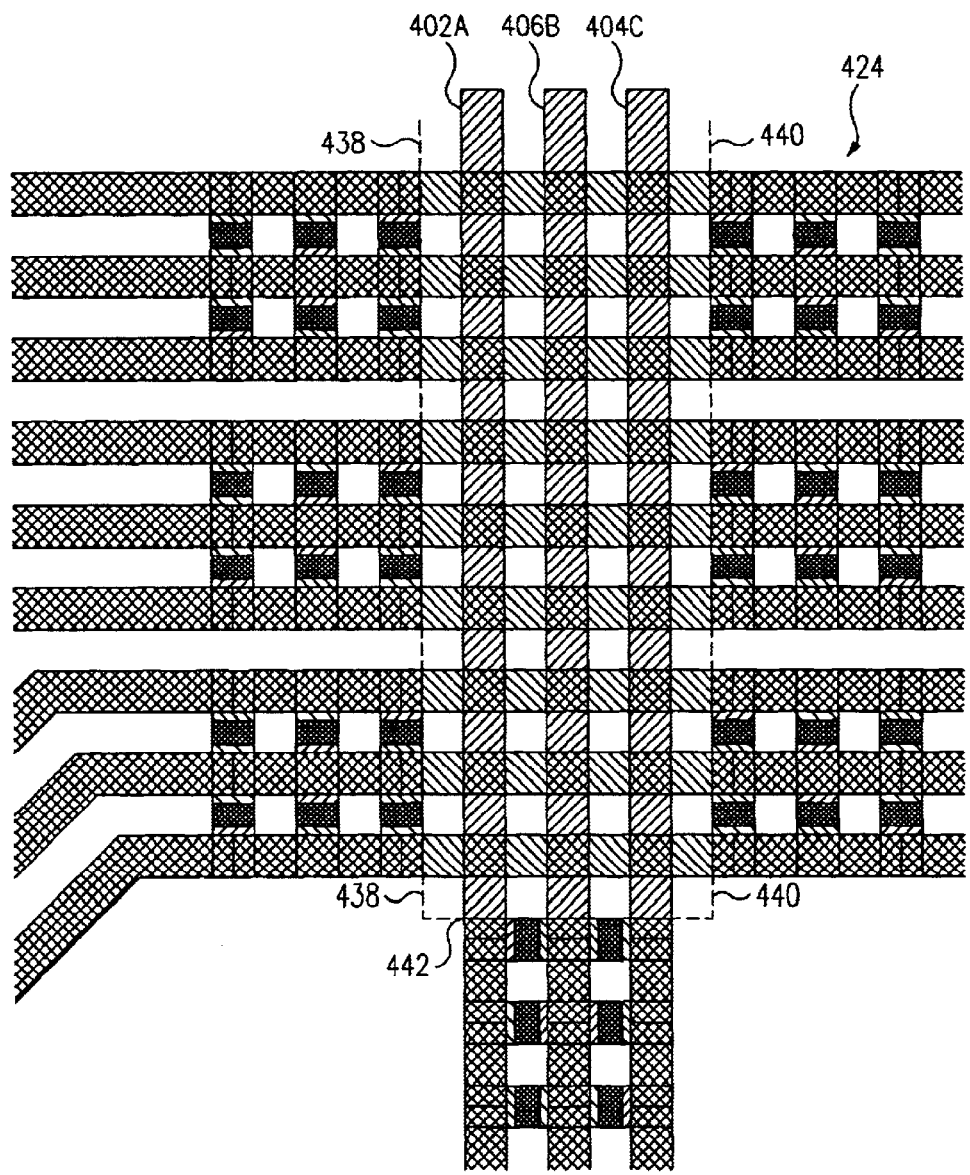
FIGS. 13 and 14 are top views of the crossover region in the transmission line element of FIG. 8.
Figure 14:
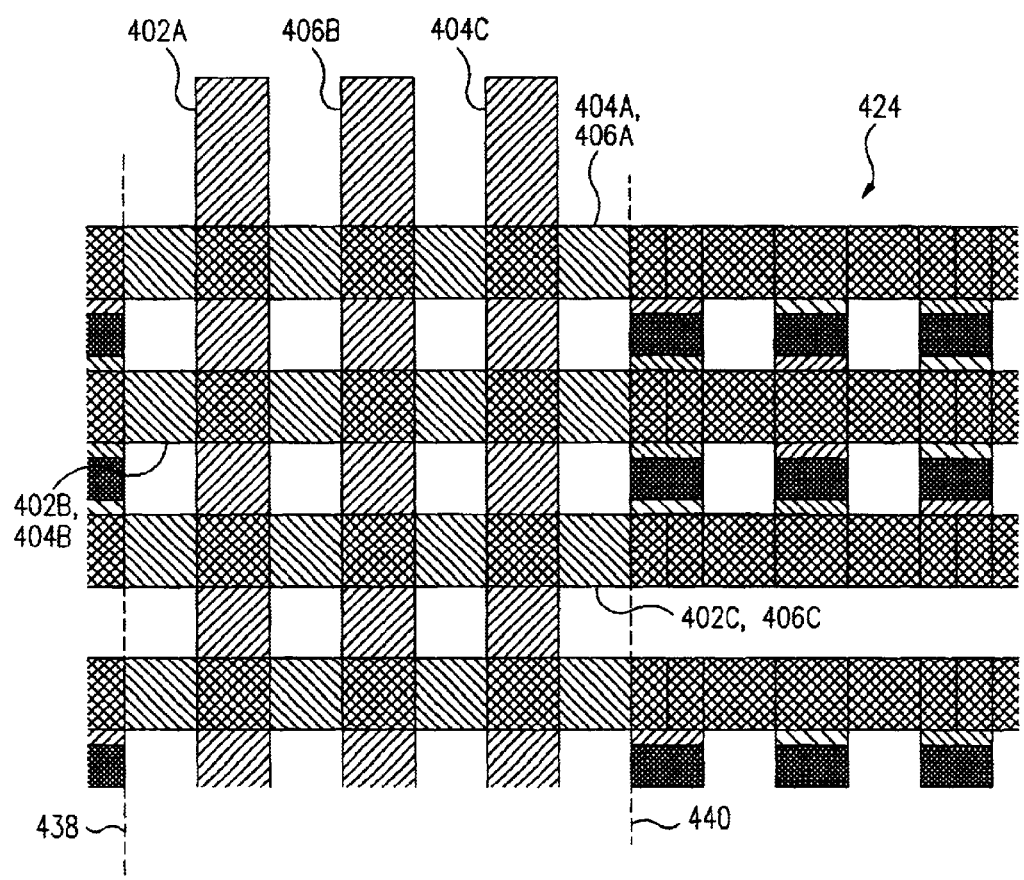

Referring again to FIG. 8, transmission line element 401 includes a crossover region 436 where the conductor pass from the inside of the spiral to terminus 414 on the outside of the spiral. Detailed views of crossover region 436 are shown in FIGS. 13 and 14. As indicated, the top metal layer T terminates at the dashed lines 438 and 440 and the middle and bottom metal layers M, B; The middle and bottom metal layers M, B terminate at the dashed line 442, and thus metal layer T passes over metal layers M, B in the crossover region 426.

Figure 7G:
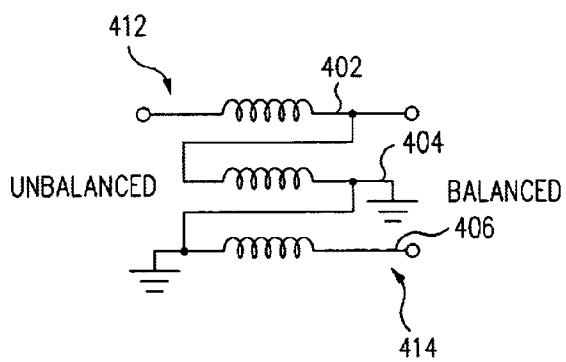

FIG. 7G is a schematic circuit diagram of a trifilar balanced-unbalanced (balun) transmission line that may be constructed using the structure illustrated in FIGS. 8–14. Conductors 402, 404 and 406 are shown, along with the terminal 412 and 414. The conductors 402, 404, 406 are connected together by vias at the locations indicated.

Although the present invention and its advantages have been described in detail, it should be understood that various changes, substitutions, and alterations can be made therein without departing from the spirit and scope of the invention as defined by the appended claims.

I claim:

1. A transmission line element formed in an integrated circuit chip comprising:

a plurality of metal layers, each of said metal layers being separated from an adjacent said metal layer by at least one dielectric layer;

a first conductor comprising at least two transmission lines in different said metal layers;

a second conductor comprising at least two transmission lines in different said metal layers, the transmission lines in said first and second conductors running parallel to each other;

a plurality of interconnects located at predetermined positions along said conductors, each of said interconnects containing an electrical connection between the transmission lines in said first conductor and an electrical connection between the transmission lines in said second conductor;

wherein at least one transmission line in said first conductor is edge-coupled to at least one transmission line in said second conductor and broadside-coupled to at least one other transmission line in said second conductor.

2. The transmission line element of claim 1 wherein at least a second transmission line in said first conductor is edge-coupled to at least one transmission line in said second conductor and broadside-coupled to at least one other transmission line in said second conductor.

3. The transmission line element of claim 1 wherein at least one of said interconnects comprises a via through said at least one dielectric layer, a first tongue extending from one of said transmission lines and a second tongue extending from another one of said transmission lines.

4. The transmission line element of claim 1 wherein said first conductor comprises two transmission lines and said second conductor comprises two transmission lines.

5. The transmission line element of claim 1 wherein said first conductor comprises three transmission lines and said second conductor comprises three transmission lines.

6. The transmission line element of claim 5 comprising three said metal layers, each of said metal layers comprising two transmission lines.

7. The transmission line element of claim 6 wherein each of said first, second and third conductors comprises three transmission lines.

8. The transmission line element of claim 5 comprising two said metal layers, each of said metal layers comprising three transmission lines.

9. The transmission line element of claim 1 comprising a third conductor.

10. The transmission line element of claim 1 wherein said first and second conductors are in the shape of a spiral.

11. A transmission line element formed in an integrated circuit chip comprising:

at least a first metal layer and a second metal layer, said first and second metal layers being separated by a first dielectric layer;

at least a first transmission line and a second transmission line formed in said first metal layer;

at least a third transmission line and a fourth transmission line formed in said second metal layer, said third transmission line lying below said first transmission line, said fourth transmission line lying below said second transmission line, said first, second, third and fourth transmission lines extending parallel to each other;

a plurality of interconnects located at predetermined positions along said transmission lines, each interconnect comprising a first electrical connection between said first and fourth transmission lines and a second electrical connection between said second and third transmission lines.

12. The transmission line element of claim 11 wherein said first electrical connection comprises:

a first via extending through said dielectric layer;

a first tongue extending from said first transmission line to said first via; and a second tongue extending from said fourth transmission line to said first via.

13. The transmission line element of claim 12 wherein said second electrical connection comprises:

a second via extending through said dielectric layer;

a third tongue extending from said second transmission line to said second via; and a fourth tongue extending from said third transmission line to said second via.

* * * * *